United States Patent
Guter

(10) Patent No.: US 10,566,486 B2
(45) Date of Patent: Feb. 18, 2020

(54) SOLAR CELL STACK

(71) Applicant: Azur Space Solar Power GmbH, Heilbronn (DE)

(72) Inventor: Wolfgang Guter, Stuttgart (DE)

(73) Assignee: Azur Space Solar Power GmbH, Heilbronn (DE)

( * ) Notice: Subject to any disclaimer, the term of this patent is extended or adjusted under 35 U.S.C. 154(b) by 310 days.

(21) Appl. No.: 14/718,561

(22) Filed: May 21, 2015

(65) Prior Publication Data
US 2015/0340533 A1 Nov. 26, 2015

(30) Foreign Application Priority Data
May 21, 2014 (EP) ..................................... 14001785

(51) Int. Cl.
*H01L 31/0725* (2012.01)
*H01L 31/0735* (2012.01)
*H01L 31/0687* (2012.01)

(52) U.S. Cl.
CPC .... *H01L 31/0725* (2013.01); *H01L 31/06875* (2013.01); *H01L 31/0735* (2013.01); *Y02E 10/544* (2013.01)

(58) Field of Classification Search
CPC ........... H01L 31/06875; H01L 31/0725; H01L 31/0735
See application file for complete search history.

(56) References Cited

U.S. PATENT DOCUMENTS

| | | | |
|---|---|---|---|
| 8,933,326 B2 | 1/2015 | Sasaki et al. | |
| 2006/0144435 A1* | 7/2006 | Wanlass | H01L 31/06875 136/249 |

(Continued)

FOREIGN PATENT DOCUMENTS

| | | |
|---|---|---|
| CN | 102782864 A | 11/2012 |
| DE | 10 2012 004 734 A1 | 9/2013 |

(Continued)

OTHER PUBLICATIONS

Klinger et al., "Determination of hardness and Young's modules for important III-V compound semiconductors," Thin Solid Films, vol. 548, No. 29, pp. 358-365 (Aug. 29, 2013).

(Continued)

*Primary Examiner* — Edward J. Schmiedel
(74) *Attorney, Agent, or Firm* — Muncy, Geissler, Olds & Lowe, P.C.

(57) ABSTRACT

A solar cell stack having a first semiconductor solar cell that has a p-n junction of a first material with a first lattice constant, and having a second semiconductor solar cell that has a p-n junction of a second material with a second lattice constant. The first lattice constant is smaller than the second lattice constant. The solar cell stack has a metamorphic buffer that includes a sequence of a first, lower AlInGaAs or AlInGaP layer and a second, center AlInGaAs or AlInGaP layer, and a third, upper AlInGaAs or AlInGaP layer, and the metamorphic buffer is formed between the first semiconductor solar cell and the second semiconductor solar cell. The lattice constant in the metamorphic buffer changes along the thickness dimension of the metamorphic buffer, and the lattice constant and the In content increase and the Al content decreases between at least two layers of the metamorphic buffer.

12 Claims, 7 Drawing Sheets

(56) References Cited

U.S. PATENT DOCUMENTS

| | | | |
|---|---|---|---|
| 2006/0162768 A1* | 7/2006 | Wanlass | H01L 31/06875 136/262 |
| 2009/0145476 A1* | 6/2009 | Fetzer | H01L 31/184 136/256 |
| 2009/0229659 A1* | 9/2009 | Wanlass | H01L 31/0725 136/255 |
| 2011/0041898 A1* | 2/2011 | Cornfeld | H01L 31/02 136/255 |
| 2011/0287578 A1* | 11/2011 | Wojtczuk | H01L 31/0684 438/94 |
| 2011/0290312 A1* | 12/2011 | Agui | H01L 31/1852 136/255 |
| 2012/0211068 A1* | 8/2012 | Cornfeld | H01L 31/06875 136/255 |
| 2012/0227797 A1 | 9/2012 | Stan et al. | |
| 2012/0247547 A1* | 10/2012 | Sasaki | H01L 31/03046 136/255 |
| 2013/0312818 A1 | 11/2013 | Cornfeld et al. | |
| 2014/0305498 A1* | 10/2014 | Liu | H01L 31/0392 136/255 |
| 2015/0053257 A1* | 2/2015 | Dimroth | H01L 31/0687 136/255 |

FOREIGN PATENT DOCUMENTS

| | | |
|---|---|---|
| EP | 2 610 924 A1 | 7/2013 |
| WO | WO 2013/132073 A2 | 9/2013 |
| WO | WO-2013132073 A2 * | 9/2013 ......... H01L 31/0687 |

OTHER PUBLICATIONS

Grassman et al., "Expanding the Palette: Metamorphic Strategies over Multiple Lattice Constant Ranges for Extending the Spectrum of Accessible Photovoltaic Materials," 37$^{th}$ IEEE Photovoltaic Spec. Conf., pp. 3375-3380 (Jun. 19, 2011).

Cotal et al., "III-V multijunction solar cells for concentrating photovoltaics," Energy & Env. Sci., vol. 2, No. 2, pp. 174-192 (Dec. 10, 2008).

Zakaria et al., "Comparison of arsenide and phosphide based graded buffer layers used in inverted metamorphic solar cells," J. Appl. Phys., vol. 112, pp. 024907-1-024907-8 (2012).

Guter et al., "Current-matched triple-junction solar cell reaching 41.1% conversion efficiency under concentrated sunlight," Appl. Phys. Let., vol. 94, pp. 223504-1-223504-3 (2009).

Jan Schöne, "Kontrolle von Spannungsrelaxation und Defektbildung in metamorphen III-V Halbleiterheterostrukturen fuer hocheffiziente Solarzellen (control of strain-relaxation and defect formation in metamorphic III-V semiconductor heterostructures for high-efficiency semiconductor solar cells)," Dissertation for Engineering faculty of Christian-Albrechts-Universitaet of Kiel, pp. 1-150 (2009).

Klinger et al., "Elastische und plastische Eigenschaften von III-V Halbleiten fuer metamorphe Pufferstrukturen (elastic and plastic properties of III-V semiconductors for metamorphic buffer structures)," 27$^{th}$ DGKK Workshop, Erlangen, Germany (Dec. 6-7, 2012).

* cited by examiner

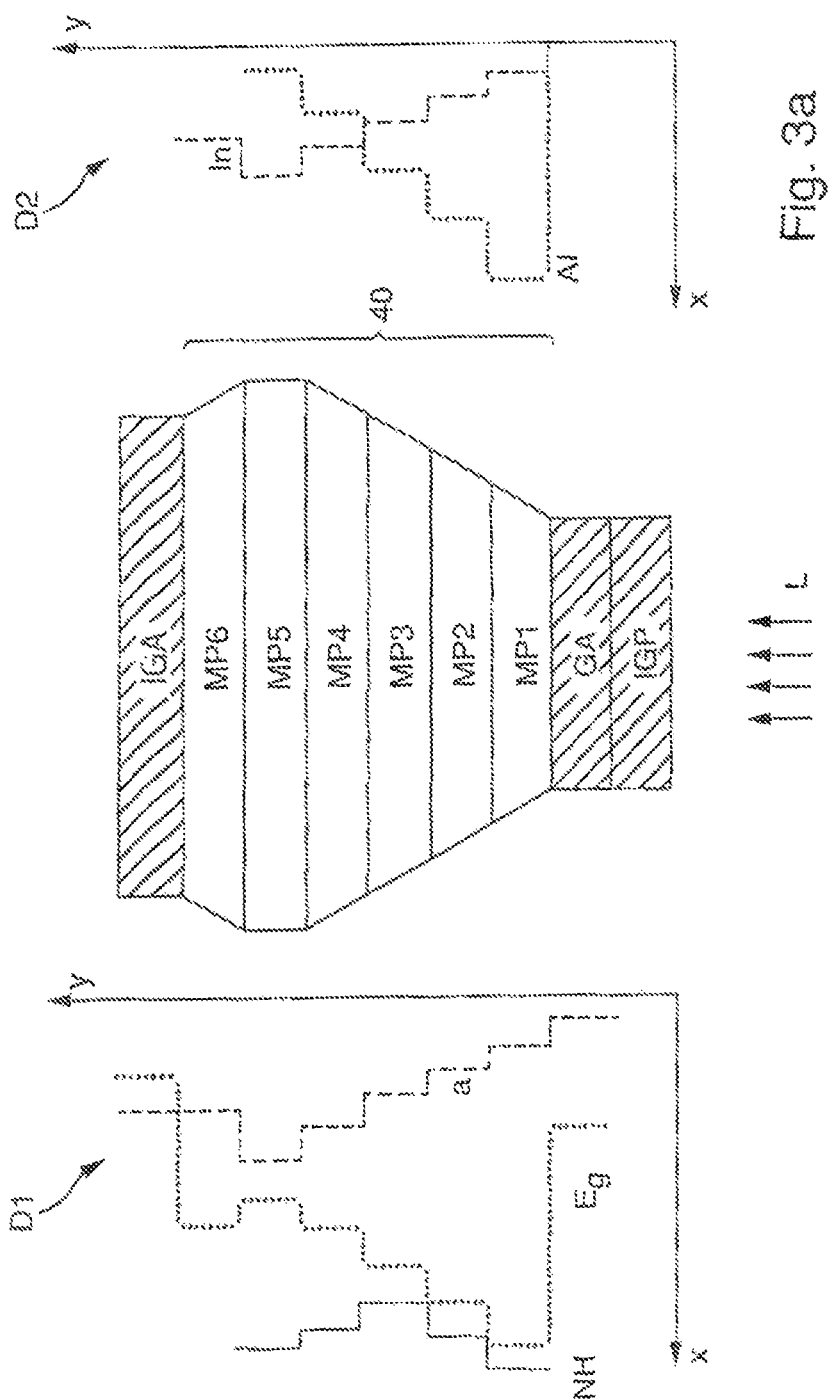

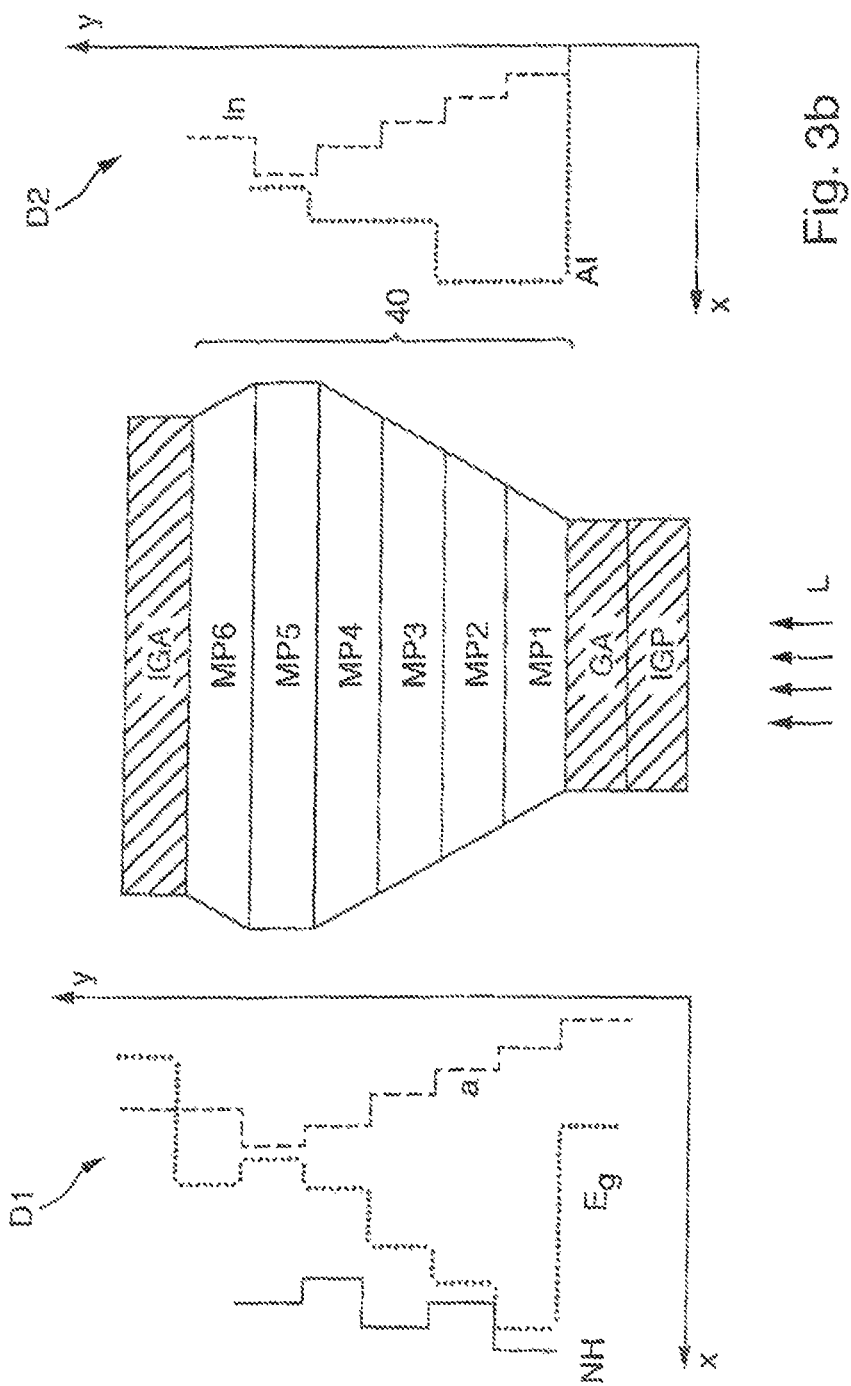

SOLAR CELL STACK

This nonprovisional application claims priority under 35 U.S.C. § 119(a) to European Patent Application No. EP 14001785.6, which was filed on May 21, 2014, and which is herein incorporated by reference.

BACKGROUND OF THE INVENTION

Field of the Invention

The present invention relates to a solar cell stack.

Description of the Background Art

In the epitaxy of III-V multi-junction solar cells, so-called metamorphic buffers are used in order to deposit on the metamorphic buffers high-quality semiconductor layers of materials with a different lattice constant than that of the substrate, or of layers located below the buffer. By means of the metamorphic buffer, a so-called "virtual substrate" is formed having a lattice constant different from that of the original substrate. As a result, it is possible to achieve greater latitude in the choice of materials, for example for the various elements of a multi-junction solar cell, and to improve the efficiency of the multi-junction solar cell.

It is desirable for the lattice constant of the metamorphic buffer to be increased in general during manufacture. By this means, most layers of the buffer are compressively strained, with the dislocations forming in a more homogeneous manner, and in particular fewer cracks arising, as compared to a tensilely strained buffer. Moreover, it is desirable for all layers of the metamorphic buffer to be transparent to light of certain wavelengths so that the light can be used in the other solar cells for photoelectric energy conversion.

Multiple solar cell stacks having a metamorphic buffer are known from "Comparison of arsenide and phosphide based graded buffer layers used in inverted metamorphic solar cells," by A. Zakaria, Richard R. King, M. Jackson, and M. S. Goorsky in *J. Appl. Phys.* 112, 024907 (2012). In addition, solar cell stacks with metamorphic buffers as depicted in FIG. 4 of the present application are known from US 20130312818 A1. Metamorphic solar cell stacks are also disclosed in "Current-matched triple junction solar cell reaching 41.1% conversion efficiency under concentrated sunlight," by W. Guter, J. Schöne, S. P. Philipps, M. Steiner, G. Siefer, A. Wekkeli, E. Welser, E. Oliva, A. Bett, and F. Dimroth, in *Applied Physics Letters* 94, 223504 (2009).

Additional solar cell stacks with metamorphic buffers are disclosed in J. Schöne, dissertation entitled "Kontrolle von Spannungsrelaxation und Defektbildung in metamorphen III-V Halbleiterheterostrukturen für hocheffiziente Halbleiter-Solarzellen" [control of strain relaxation and defect formation in metamorphic III-V semiconductor heterostructures for high-efficiency semiconductor solar cells], 2009, Faculty of Engineering at Kiel University, Germany.

Furthermore, it is desirable in metamorphic buffers to relieve lattice strains through the formation of dislocations or other crystal defects in the buffers themselves, with the crystal defects remaining localized in the buffers as much as possible. In particular, threading dislocations should be prevented from propagating into other parts of the semiconductor layer stack. To this end, it is preferred to have the hardness of the buffer layers in the metamorphic buffers increase with the lattice constant, in order, in particular, to reduce the propagation of dislocations into layers located thereabove and/or to hinder the relaxation of layers located thereabove. In contrast thereto, it is disclosed by V. Klinger, T. Roesener, G. Lorenz, M. Petzold, and F. Dimroth, in "Elastische und plastische Eigenschaften von III-V Halbleitern für metamorphe Pufferstrukturen" [elastic and plastic properties of III-V semiconductors for metamorphic buffer structures], 27$^{th}$ DKGG Workshop, "Epitaxie von III/V-Halbleitern," Erlangen, Germany, Dec. 6-7, 2012, that for a metamorphic buffer as shown in FIG. 5 of the present invention made of the ternary compound Al0.4InxGa0.6-x (0<x<0.6) in which the element gallium is successively replaced by indium, the lattice constant increases with the indium content, while the nanohardness decreases, shown as a solid line in the present FIG. 2.

SUMMARY OF THE INVENTION

It is therefore an object of the present invention to provide a device that advances the state of the art.

According to an embodiment of the invention, a solar cell stack is provided, having a first semiconductor solar cell, wherein the first semiconductor solar cell has a p-n junction of a first material with a first lattice constant, and having a second semiconductor solar cell, wherein the second semiconductor solar cell has a p-n junction of a second material with a second lattice constant, and wherein the first lattice constant is smaller than the second lattice constant, and the solar cell stack has a metamorphic buffer, wherein the metamorphic buffer comprises a sequence of a first, lower AlInGaAs or AlInGaP layer and a second, center AlInGaAs or AlInGaP layer, and a third, upper AlInGaAs or AlInGaP layer, and the metamorphic buffer is formed between the first semiconductor solar cell and the second semiconductor solar cell, wherein the lattice constant in the metamorphic buffer changes along the thickness dimension, which is to say along the sequence of the layers of the metamorphic buffer, and wherein the In content increases and the Al content decreases between at least two layers of the metamorphic buffer. The three layers follow one another in direct succession. Furthermore, additional layers can be formed both between the first and second layers and/or between the second and third layers.

A minimum number of layers in the metamorphic buffer can be three, but depending on the application six layers or up to thirty or more individual layers can be provided. In addition, it should be noted that the individual layers of the metamorphic buffer generally are made thin, preferably below 600 nm, and extremely preferably below 300 nm. In addition, the lattice constant of a material refers to the unstrained state. In particular, at the interface between two layers, the lateral (in-plane) lattice constants of the two adjacent layers are always nearly identical, while the vertical (out-of-plane) lattice constants and the lattice constant in the unstrained state differ.

An advantage of the device according to an embodiment of the invention is that the formation of an especially soft layer, which is to say a layer with a lower nanohardness, takes place within the buffer as a result of the high Al content in the first, lower layer of the metamorphic buffer despite a further increasing lattice constant in comparison to the layer above and the layer below. The term "nanohardness" can refer in the following to the hardness of the applicable layer of the buffer. It should be noted that the nanohardness can be considered to a first approximation as being homogeneous and constant within the individual layer. In addition, it should be noted that the term "first, lower layer" refers to the layer that is formed closest to the first semiconductor solar cell. The creation of a soft layer facilitates a formation of mismatch dislocations in the first, lower layer. Investigations have shown that the dislocations form by preference in the first layer and remain in the first layer, and do not advance into the active layers of the semiconductor solar cells located below and/or above it. An undesirable reduction in the charge carrier diffusion lengths in the active layers and a reduction in the efficiency of the semiconductor solar cells in the solar cell stack are prevented in this way. In other words, the creation of the first layer with the highest aluminum content as compared to the other layers of the metamorphic buffer, and also in comparison to the additional layers that are directly integrally connected to the metamorphic buffer, forms a sort of "predetermined breaking point" in that the first layer is made especially soft in comparison with the surrounding layers.

When the hardness of the semiconductor layers in the metamorphic buffer increases according to the invention with the lattice constants, layers with a larger lattice constant and greater hardness are repeatedly prevented from relaxing before layers with a smaller lattice constant and lesser hardness are almost fully relaxed. In each case the softest layer that is not fully relaxed forms a "predetermined breaking point."

Another advantage is that with the introduction of the first layer, a bending of the semiconductor substrate under the effects of compressive or tensile stress is reduced. Particularly in the epitaxial growth of additional layers, better homogeneity and better reproducibility of layer growth are achieved, and all layers of the solar cell stack can be produced in situ. As a result, semiconductor solar cells with very different lattice constants or band distance, hereinafter also referred to as energy of the band gaps, can be grown on one another easily, economically, and with high efficiency within the framework of an epitaxy process. The formation of defects or dislocations is reliably facilitated by the "predetermined breaking point" within the metamorphic buffer, contributing to the relaxation of the semiconductor layer stack, with the propagation of the defects and dislocations in regions outside the metamorphic buffer simultaneously being suppressed by the shape of the hardness gradient.

Another advantage is that the solar cell stack according to an embodiment of the invention has a lower residual strain after its manufacture. This results in increased operational reliability and higher efficiencies in the solar cell stacks.

Another advantage is that multiple semiconductor solar cells with different lattice constants and band gaps can easily be joined to form the solar cell stack in such a manner that the overall efficiency of the solar cell stack is increased.

In an embodiment, in a sequence of three layers of the metamorphic buffer, the In content and the lattice constant each increase from one layer to a subsequent layer, and the Al content decreases. It is especially preferred for the In content to increase by at least 1% and the Al content to decrease by at least 1% between at least two layers of the metamorphic buffer.

In an embodiment, the first layer of the metamorphic buffer has a greater lattice constant than the first semiconductor solar cell. In an embodiment, the aluminum content of the first layer can be greater than or at least as great as the aluminum content of any other layer of the metamorphic buffer. Dislocations are formed in the first softest layer of the metamorphic buffer.

In an embodiment, the lattice constant of the metamorphic buffer can increase from layer to layer in the direction of the second semiconductor solar cell, for example, by at least 0.003 Å at a time, and extremely preferably by at least 0.005 Å at a time.

In an embodiment, one layer of the metamorphic buffer can have a third lattice constant. The third lattice constant can be greater than the lattice constant of the second semiconductor solar cell. Investigations have shown that the relaxation of the metamorphic buffer can be further improved by this means.

In an embodiment, the metamorphic buffer can have a fourth layer above and integrally joined to the third layer. The lattice constant of the fourth layer can be less than the lattice constant of the third layer. In detailed investigations, it was demonstrated that the curvature of the wafers can be further optimized, for example, can be reduced due to the metamorphic growth through appropriate selection of the lattice constant and layer thickness of the fourth layer.

In an embodiment, only AlInGaAs layers or only AlInGaP layers are formed within the sequence of layers in the metamorphic buffer.

In an embodiment, in a sequence of four layers the first layer can have a smaller lattice constant and a smaller nanohardness than the second layer, and the third layer can have a larger lattice constant and a larger nanohardness than the second layer. In addition, a fourth layer can be provided and can have a smaller lattice constant and a smaller nanohardness than the third layer. As a result, the relaxation of the lattice mismatch of the underlying layers is improved through the formation of additional mismatch dislocations. In embodiment, in a sequence of three layers the first layer can be integrally joined to the second layer, and the second layer can be integrally joined to the third layer.

In another embodiment, a third semiconductor solar cell is provided, wherein an additional metamorphic buffer can be formed between the second semiconductor solar cell and the third semiconductor solar cell. In other words, in the solar cell stack as a whole, two metamorphic buffers can be formed that are spatially separated from one another by at least one solar cell. In another embodiment, a sequence of two metamorphic buffers can be formed between two semiconductor solar cells. Furthermore, each of the semiconductor solar cells can have a p-n junction. Furthermore, it should be noted that the metamorphic buffer layers are not part of a p-n junction of a tunnel diode.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 3a shows another view of the embodiment of the solar cell stack from FIG. 1 with a metamorphic buffer, FIG. 3b shows a view of an embodiment of the solar cell stack from FIG. 1 with a metamorphic buffer.

DETAILED DESCRIPTION

Figure 1:
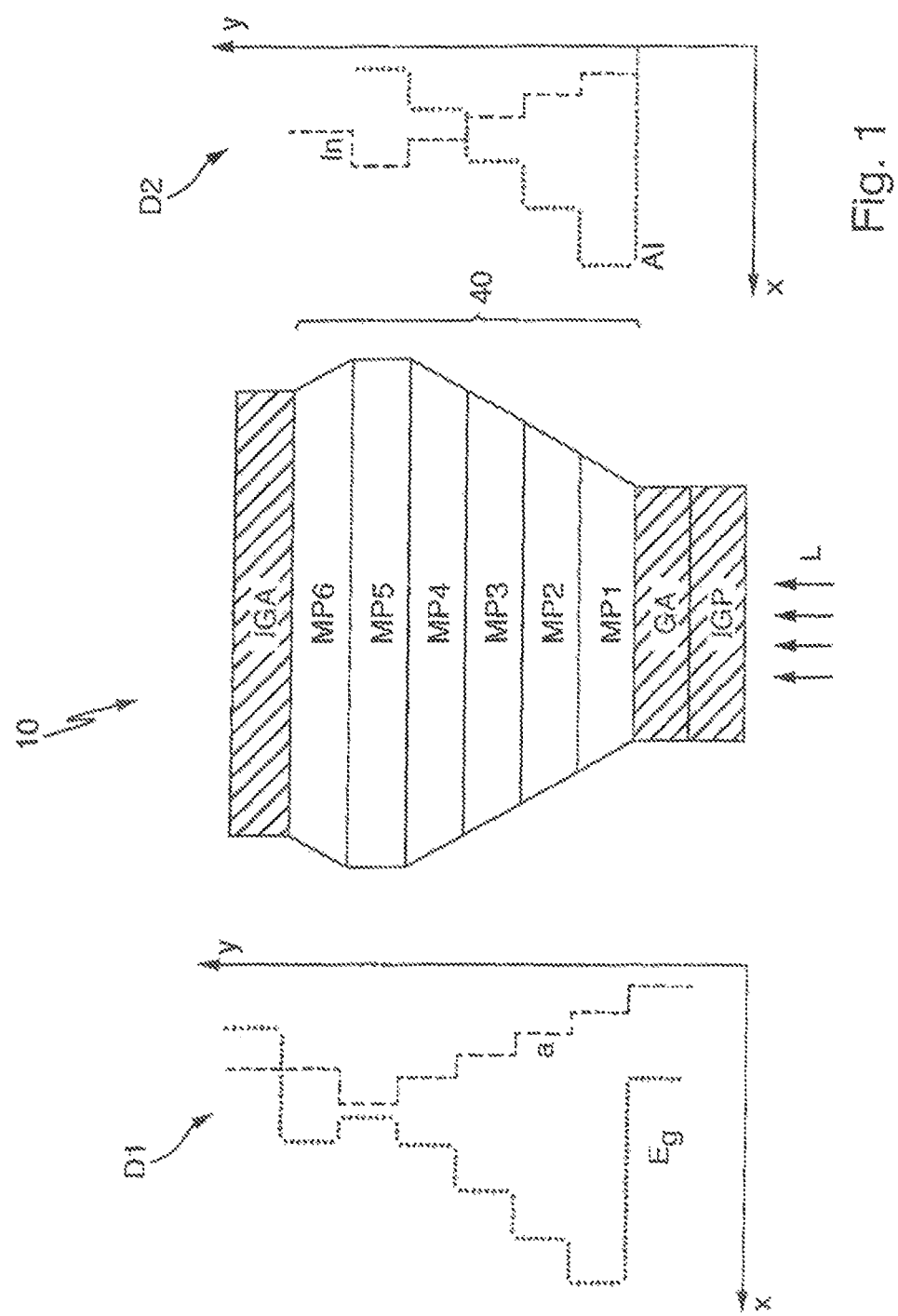
FIG. 1 shows an embodiment according to the invention of a solar cell stack with a metamorphic buffer.

The illustration in FIG. 1 shows a schematic view of a solar cell stack 10 with a semiconductor solar cell IGP, wherein the semiconductor solar cell IGP has a p-n junction of one material with one lattice constant, and with a first semiconductor solar cell GA, wherein the first semiconductor solar cell GA has a p-n junction of a first material with a first lattice constant, and with a second semiconductor solar cell IGA, wherein the second semiconductor solar cell IGA has a p-n junction of a second material with a second lattice constant, and wherein the first lattice constant corresponds to the second lattice constant (lattice-matched), and the third lattice constant is larger than the second lattice constant. Formed between the first semiconductor solar cell GA and the second semiconductor solar cell IGA of the solar cell stack 10 is a metamorphic buffer 40 in order to serve as an intermediary between the different lattice constants of the two semiconductor solar cells GA and IGA. Light L is incident on the solar cell stack 10 through the semiconductor solar cell IGP. The labels of the individual solar cells GA, IGA, IGP indicate in this exemplary embodiment the chemical substances used by preference, which is to say GA stands for gallium arsenide, IGA for indium gallium arsenide, and IGP for indium gallium phosphide.

In the representation of the individual layers of the metamorphic buffer 40, the depicted width of each given layer is a measure for the in-plane lattice constant "a" of the applicable layer. In the individual layers, the lattice constant a is represented in some cases as unchanging and also as increasing or as decreasing across the thickness of the layer. It is a matter of course that the two in-plane lattice constants a at the boundary between two layers, also referred to as lateral lattice constant a, of the abutting layers are approximately equal.

In the present case, the metamorphic buffer 40 has a total of six individual layers. Formed on the first solar cell GA is a first metamorphic layer MP1 of the metamorphic buffer 40 with a somewhat larger lattice constant than the lattice constant of the first solar cell GA. Arranged on the first layer MP1 is a second metamorphic layer MP2 formed with a somewhat larger lattice constant than the lattice constant of the first metamorphic layer MP1. Arranged on the second layer MP2 is a third metamorphic layer MP3 formed with a somewhat larger lattice constant than the lattice constant of the second metamorphic layer MP2. Arranged on the third layer MP3 is a fourth metamorphic layer MP4 formed with a somewhat larger lattice constant than the lattice constant of the third metamorphic layer MP3. Arranged on the fourth layer MP4 is a fifth metamorphic layer MP5 formed with a somewhat larger lattice constant than the lattice constant of the fourth metamorphic layer MP4. Arranged on the fifth layer MP5 is a sixth metamorphic layer MP6 formed with a somewhat smaller lattice constant than the lattice constant of the fifth metamorphic layer MP5. Formed such that it rests on the sixth layer MP6 is the second solar cell IGA.

To elucidate the embodiment according to the invention, selected physical parameters for the region of the metamorphic buffer 40 between the first semiconductor solar cell GA and the second semiconductor solar cell IGA are plotted parallel to the solar cell stack 10 in a first graph D1 and in a second graph D2. In the first graph D1, the magnitude of the lattice constant a—dashed curve—and the magnitude of the band gap Eg—dotted curve—are plotted along the x-axis, while the sequence of the individual layers of the buffer 40 is represented along the y-axis. Plotted along the x-axis in the second graph D2 are the indium content—dashed curve—and the aluminum content—dotted curve—of (In)GaP or (Al)InGaAs, while the sequence of the individual layers of the buffer 40 is again represented along the y-axis. The curves for In and Al are each labeled only with the chemical symbol in the graph D2. For reasons of clarity, only the complete names of the relevant chemical elements are given below.

In the first graph D1, it is apparent that the lattice constant a increases from the first semiconductor solar cell GA to the fifth metamorphic layer MP5, and at the sixth metamorphic layer MP6 decreases, to then remain constant in the subsequent second solar cell IGA. For reasons of clarity, the curve of the unstrained lattice constant a is shown in steps. It should be noted, however, that the in-plane lattice constant changes nearly continuously in the generally thin layers of the buffer. In the present case, layers with thicknesses of less than 600 nm are referred to as thin layers. In contrast to the curve of the lattice constant a, the energy of the band gap Eg increases abruptly from the second solar cell to the first metamorphic layer MP1. In the curve from the first metamorphic layer MP1 to and including the fifth metamorphic layer MP5, the energy of the band gap Eg decreases in steps. From the fifth metamorphic layer MP5 to the sixth metamorphic layer MP6, the energy of the band gap Eg increases again, to ultimately decrease between the sixth metamorphic layer MP6 and the second solar cell IGA to below the level of the first solar cell GA.

In the second graph D2, it is apparent that the first metamorphic layer MP1 has the highest aluminum content as compared to the subsequent layers MP2 to MP6. Starting from the first layer MP1, the aluminum content decreases in steps in the subsequent layers MP2 to MP6, with the step MP6 having the lowest aluminum content.

In contrast to the aluminum content curve, the indium content rises in steps from the first metamorphic layer MP1 to and including the fifth metamorphic layer MP5. Then the indium content decreases again from the fifth metamorphic layer MP5 to the sixth metamorphic layer MP6. In other words, the fifth metamorphic layer MP5 has the highest indium content in the metamorphic buffer. It should be noted here, too, that the individual compositions in each of the layers are represented as homogeneous for reasons of clarity. The composition can change virtually continuously, at least at the boundaries between two contiguous layers.

Figure 2:
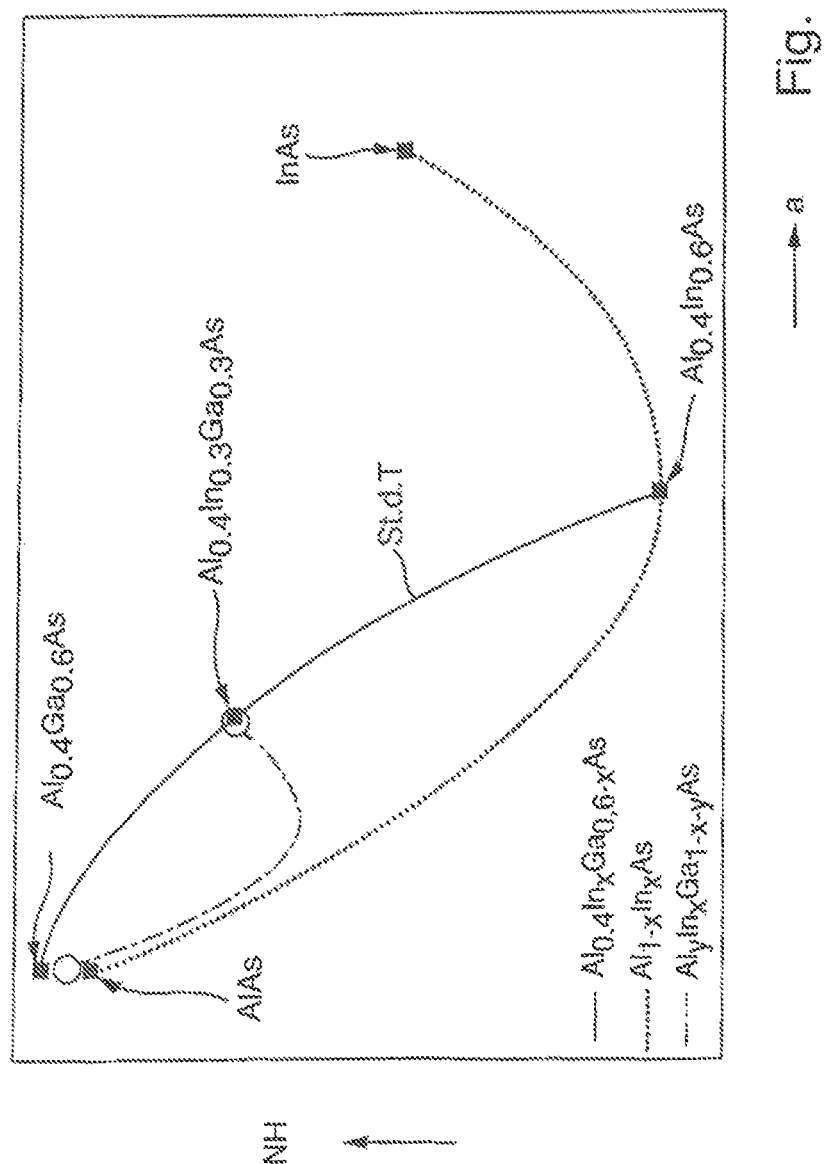
FIG. 2 shows a nanohardness as a function of the lattice constant for various stoichiometries.

In the illustration in FIG. 2, the nanohardness, NH, is plotted over the lattice constant, a, for different $Al_yIn_xGa_{1-x-y}As$ compound semiconductor compositions. For reasons of clarity, only the chemical formula designation of the compound semiconductor compositions is cited below.

The solid line represents a prior art curve, as already referenced above. Furthermore, investigations have demonstrated that—results are represented with a dashed line—when progressing from a binary compound AlAs to a ternary compound of $Al_{1-x}In_xAs$ to a binary compound InAs, which is to say Al is successively replaced by In, the lattice constant a rises starting from the binary AlAs, while the nanohardness NH decreases to a minimum at an In content of approximately 0.6 before the nanohardness NH increases again as the In content continues to rise, with the element In fully replacing the element Al in the end. It is a disadvantage in this curve that the nanohardness NH only increases at large lattice constants a and very high In content, above 0.6.

If the lattice constant of the third solar cell IGA in the present case is smaller than that of Al0.4In0.6As, then it is not possible to achieve the effect in the buffer of the hardness increasing with the lattice constant a.

Other investigations, shown with a dashed-and-dotted line, have demonstrated that an increase in the nanohardness NH with the lattice constant a can be achieved, even at low In content, using a combination according to the invention of the elements Al, In, and Ga, in particular for a quaternary compound AlyInx-Ga1-x-yAs. To this end, the nanohardness is first reduced, in particular starting from AlyGa1-yAs or AlyInxGa1-x-yAs, by replacing Al with In, before the nanohardness NH increases again with a substantially smaller lattice constant a as compared to the dashed curve by suitable replacement of Al with In and Ga. In other words, an increase in the nanohardness NH with the lattice constant can now be achieved at In content levels far below 0.6, which is to say at small lattice constants.

It is an advantage that individual layers with a higher nanohardness NH, as compared to an underlying layer, at a small lattice constant a can be inserted at virtually any desired location within the metamorphic buffer in order to influence the propagation of dislocations and relaxation by this means. It is preferred here that relaxation occurs in the soft layer. Formation of additional so-called blocking layers outside of the metamorphic buffer is unnecessary.

The illustration in FIG. 3a shows another representation of the solar cell stack with a sequence of layers corresponding to FIG. 1. Only the differences from the embodiment shown in FIG. 1 are explained below. In the graph D1, the curve of the nanohardness NH is shown for the first five layers MP1 to MP5. According thereto, the nanohardness NH of the first layer MP1 is the highest, and decreases in steps to a minimum value in the third layer MP3, to subsequently increase in steps again to the fifth layer MP5 despite the lattice constant a continuing to increase. As a result, an especially soft layer MP3 is formed in the center of the buffer 40. Even though the hardness of the layer MP5 can be lower than in the layer MP1, the hardness of the buffer increases in layers MP3 to MP5 at larger lattice constants, and suppresses the propagation of dislocations.

The illustration in FIG. 3b shows an additional representation of the solar cell stack with a sequence of layers corresponding to FIG. 1. Only the differences from the embodiment shown in FIG. 1 are explained below. In the graph D2, the curve of the aluminum content of the first five buffer layers MP1 to MP5 is shown. Here, the aluminum content is the same in layers MP1 and MP2, but decreases at the transition to layer MP3. Layers MP3 and MP4 again have the same aluminum content, and layer MP5 has a still lower aluminum content. In the graph D1, the curve of the nanohardness NH is shown for the first five layers MP1 to MP5. According thereto, the nanohardness NH of the first layer MP1 is the highest, and decreases in steps to the second layer MP2, to subsequently increase in steps again to the third layer MP3. Here, however, the nanohardness NH of the third layer MP3 is lower than the nanohardness NH of the first layer MP1. Starting from the third layer MP3, the nanohardness NH decreases in steps to the fourth layer MP4, with the nanohardness NH of the fourth layer MP4 being lower, however, than the nanohardness NH of the second layer MP2. Starting from the fourth layer MP4, the nanohardness NH increases in steps to the fifth layer MP5, with the nanohardness NH of the fifth layer MP5 being lower, however, than the nanohardness NH of the third layer MP3, and lower than the nanohardness NH of the first layer MP1.

It is an advantage of the formation of multiple minima with respect to the nanohardness NH that relaxation, if relaxation occurs at all, takes place in the soft layers within the buffer, and suppression of the propagation of dislocations in the semiconductor solar cells is effectively inhibited via the multiple soft layers of the buffer.

Figure 3C:
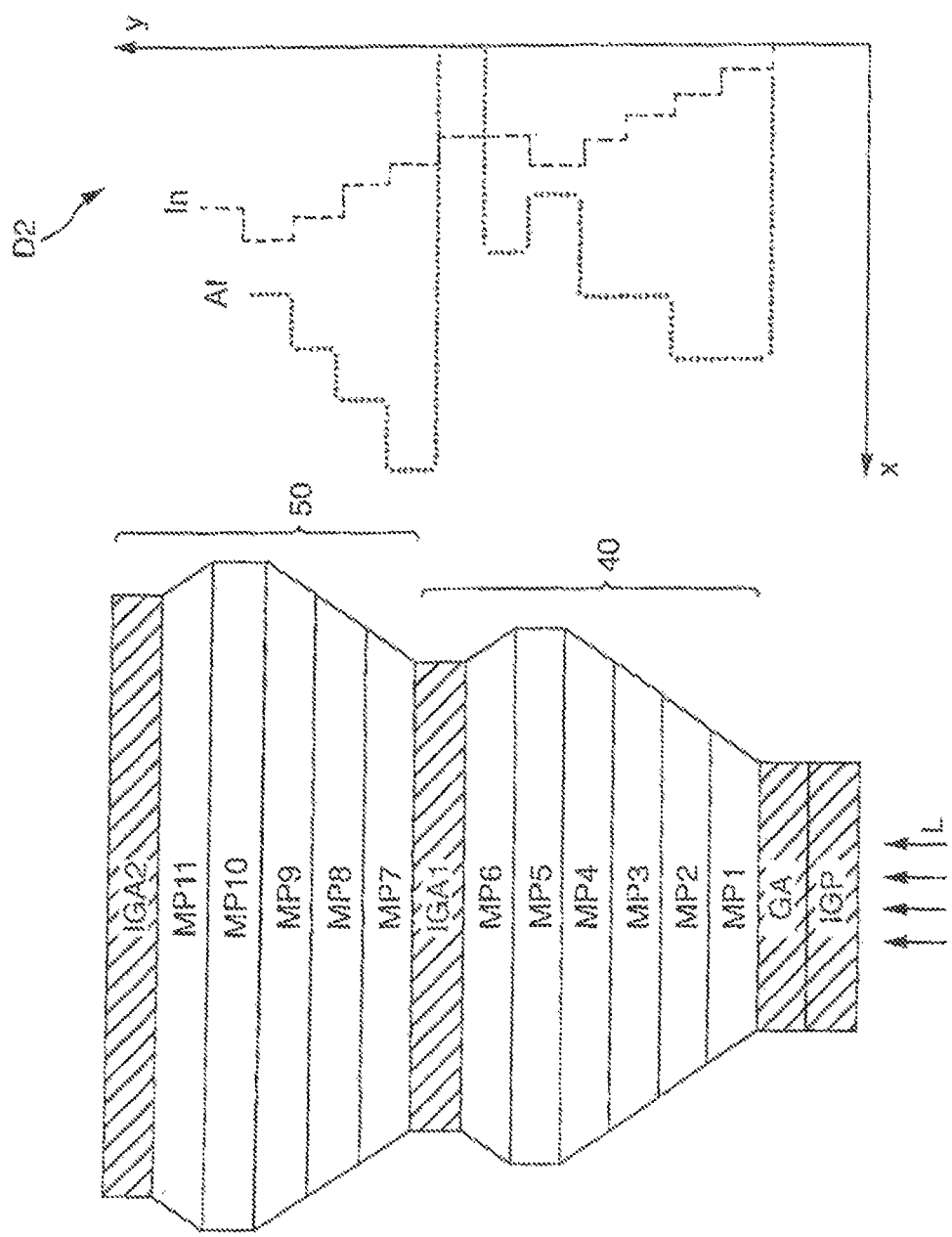
FIG. 3c shows an embodiment according to the invention with two metamorphic buffers.

The illustration in FIG. 3c shows a second embodiment according to the invention with a sequence of two metamorphic buffers, one atop the other, which is to say the metamorphic buffer 40 and another metamorphic buffer 50. Only the differences from the embodiment shown in conjunction with FIG. 1 are explained below. Formed on the second solar cell with a different or even the same second lattice constant, in the present case labeled IGA1 instead of IGA, is a second metamorphic buffer 50 with a sequence of a total of five metamorphic layers, starting with the seventh metamorphic layer MP7 up to and including the eleventh metamorphic layer MP11. Adjoining the eleventh metamorphic layer MP11 is a third solar cell IGA2. The lattice constant a of the second metamorphic buffer 50 is, on average, greater than the average lattice constant a of the first buffer 40. It is apparent that the relative curve of the lattice constant is comparable in the sequence of the layers in each buffer, which is to say the penultimate layer of the first buffer 40 and the penultimate layer of the second metamorphic buffer 50 each have the largest lattice constant a within the applicable buffer.

For reasons of clarity, the first graph D1 is not shown for the two buffers. Shown in the second graph D2 are the curve of the aluminum concentration and the curve of the indium concentration for the two buffers 40 and 50. According thereto, the first layer MP1 and the second layer MP2 within the first buffer 40 have the same aluminum concentration, and the highest aluminum concentration, in the first buffer 40. Starting from the second layer MP2, the aluminum concentration decreases in steps to the third layer MP3 and the fourth layer MP4, with the aluminum concentration being the same in the third layer MP3 and the fourth layer MP4. Starting from the fourth layer MP4, the aluminum concentration decreases stepwise to the fifth layer MP5, and then increases again in steps to the sixth layer MP6. However, the aluminum concentration of the sixth layer MP6 here is smaller than the aluminum concentration of the fourth layer MP4. The second solar cell IGA1 has no aluminum concentration.

In the second buffer 50, the seventh layer MP7 has the highest aluminum concentration. Starting from the seventh layer MP7, the aluminum concentration decreases in steps from layer to layer until the tenth layer.

With regard to the indium concentration, a stepwise increase is implemented from layer to layer in the first buffer 40, starting from the first layer MP1 until the fifth layer MP5. Starting from the fifth layer MP5 until the sixth layer MP6 and the second semiconductor solar cell IGA1, the indium concentration decreases stepwise to approximately the concentration of the fourth layer MP4, to then increase in steps again in the further course of the additional sequence of layers until the seventh layer MP7 in the second buffer 50. Starting from the seventh layer MP7, a stepwise increase in the indium concentration is implemented from layer to layer until the tenth layer MP10. Starting from the tenth layer MP10 until the eleventh layer MP11, the indium concentration decreases stepwise to approximately the concentration of the ninth layer MP9.

It should be noted that it is preferred for the curves of the nanohardness NH shown in connection with the second and third embodiments according to the invention to be implemented in the fourth embodiment as well. The different implementations of the curve of the nanohardness NH can also be combined.

It is an advantage that relatively great lattice differences of individual semiconductor solar cells that are to be stacked upon one another in situ can easily be compensated for with the manufacture of a sequence of multiple metamorphic buffers. In the process, possible dislocations can be reliably trapped in the softer layers of the metamorphic buffers 40 and 50.

Figure 4:
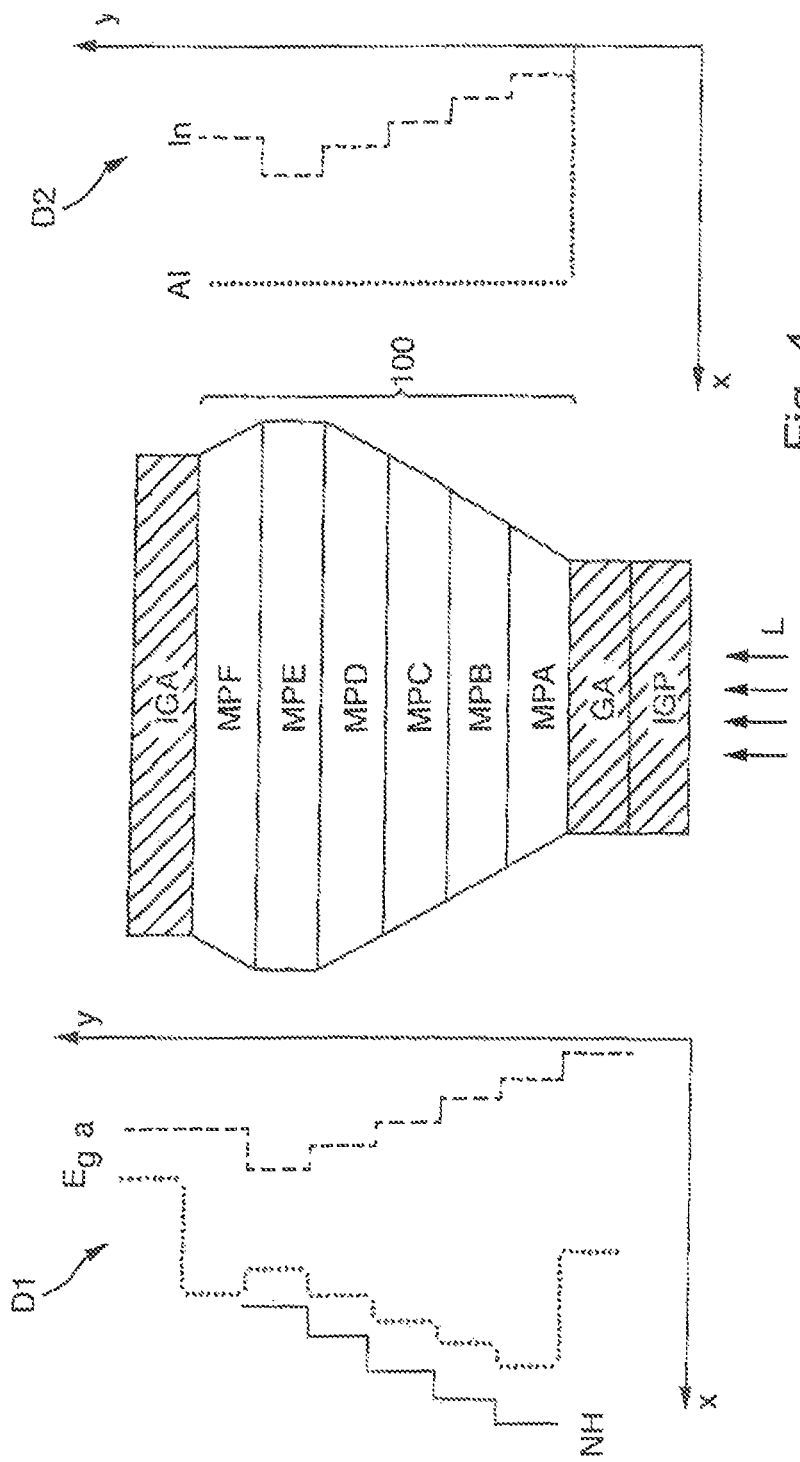
FIG. 4 shows a view of metamorphic buffers according to the prior art.
Figure 5:
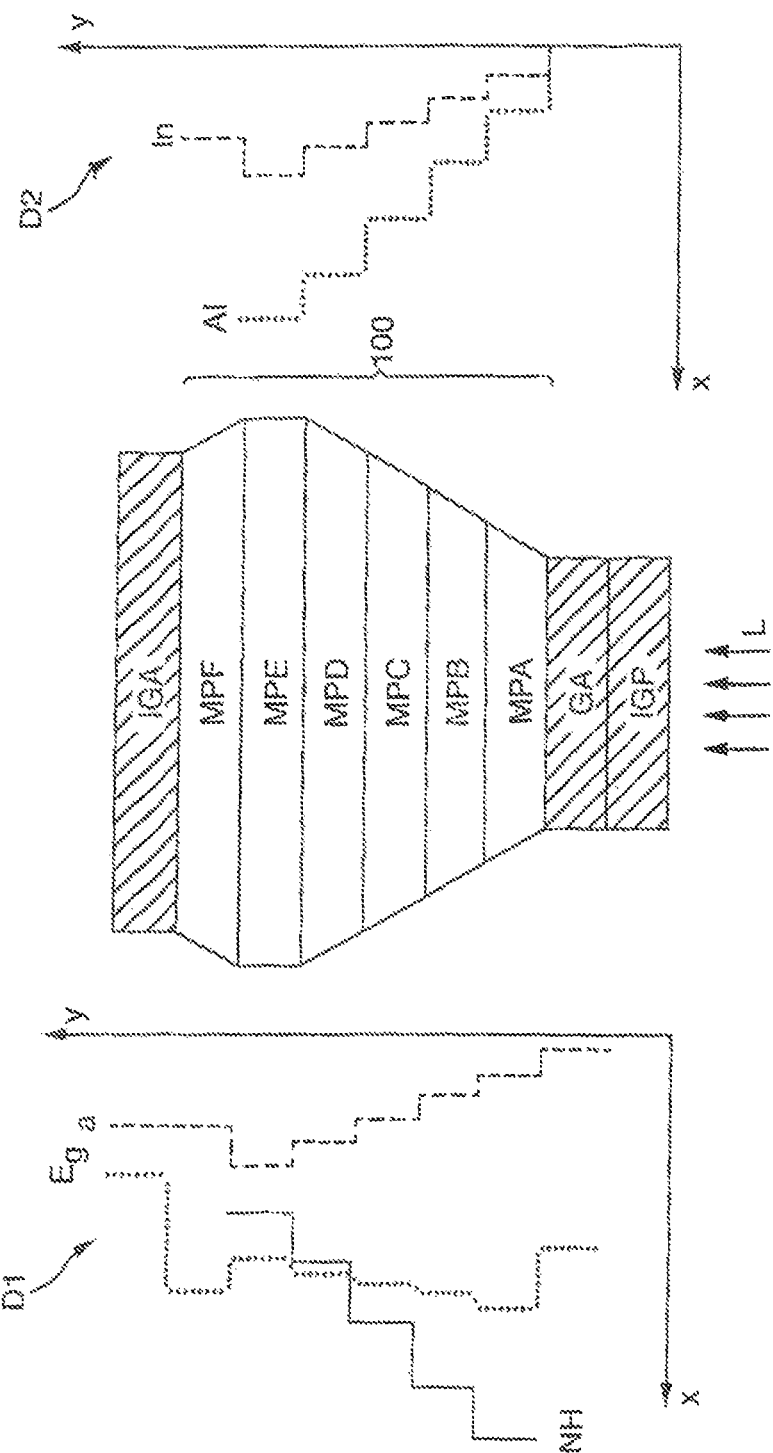
FIG. 5 shows a view of metamorphic buffers according to the prior art.

Embodiments according to the prior art of a metamorphic buffer 100 are included in FIG. 4 and FIG. 5. In the present case, the metamorphic buffer 100 likewise includes six metamorphic layers MPA to MPF. For reasons of clarity, the curves for the lattice constant a and the band gap Eg, the nanohardness NH for the applicable first graph D1, and the curves of the aluminum concentration and indium concentrations for the applicable graph D2 are shown in both FIGS. 4 and 5.

It is apparent for the embodiment shown in FIG. 4 that the nanohardness NH decreases stepwise from the first layer MPA until the fifth layer MPE of the buffer 100 according to the first graph D1. In the second graph D2, the aluminum concentration within the buffer 100 is constant. This material combination is often chosen according to the prior art so that all buffer layers have sufficient transparency for light that can still be used for photoelectric energy conversion in underlying solar cells. However, this is disadvantageous for the relaxation.

In FIG. 5, the curve of the nanohardness NH corresponds to the embodiment in FIG. 4, while the curve of the aluminum concentration within the buffer 100 continuously rises in steps. This material combination is often chosen according to the prior art so that all buffer layers have sufficient transparency for light that can still be used for photoelectric energy conversion in underlying solar cells. AlInGaAs and AlInGaP layers with lower In content or smaller lattice constants are generally more transparent than layers with higher In content in any case. Consequently, a lower Al content can also be chosen for layers with a low In content in order to ensure sufficient transparency. However, this, too is disadvantageous for the relaxation.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A solar cell stack comprising:
   a first semiconductor solar cell having a p-n junction of a first material with a first lattice constant;
   a second semiconductor solar cell having a p-n junction of a second material with a second lattice constant, the first lattice constant being smaller than the second lattice constant; and
   a metamorphic buffer comprising a sequence of layers having at least a first, lower AlInGaAs or AlInGaP layer, and a second, center AlInGaAs or AlInGaP layer, and a third, upper AlInGaAs or AlInGaP layer, the metamorphic buffer being formed between the first semiconductor solar cell and the second semiconductor solar cell,
   wherein the first, lower AlInGaAs or AlInGaP layer of the metamorphic buffer directly contacts the first semiconductor solar cell, and the third, upper AlInGaAs or AlInGaP layer of the metamorphic buffer directly contacts the second semiconductor solar cell,
   wherein the metamorphic buffer is not part of a p-n junction of a tunnel diode,
      wherein a lattice constant in the metamorphic buffer changes along a thickness dimension of the metamorphic buffer, and
      wherein, the lattice constant in the metamorphic buffer, a nano-hardness, and an In content increase across the sequence of layers in a first direction, and an Al content decreases across the sequence of layers in the first direction.

2. The solar cell stack according to claim 1, wherein, the In content and the lattice constant in the metamorphic buffer, and the Al content decreases from layer to layer in the sequence of layers.

3. The solar cell stack according to claim 1, wherein the In content increases by at least 1% and the Al content decreases by at least 1% between at least two layers of the metamorphic buffer.

4. The solar cell stack according to claim 1, wherein the lattice constant in the metamorphic buffer increases from layer to layer from the first semiconductor solar cell to the second semiconductor solar cell by at least 0.003 Å at a time.

5. The solar cell stack according to claim 1, wherein the lattice constant of the metamorphic buffer increases from layer to layer in the first direction by at least 0.005 Å at a time.

6. The solar cell stack according to claim 1, wherein one layer of the metamorphic buffer has a third lattice constant, and the third lattice constant is greater than the lattice constant of the second semiconductor solar cell.

7. The solar cell stack according to claim 1, wherein only AlInGaAs layers or only AlInGaP layers are formed within the sequence of layers in the metamorphic buffer.

8. The solar cell stack according to claim 1, wherein, in the sequence of layers in the metamorphic buffer, the first, lower layer of the sequence has a smaller lattice constant and a smaller nanohardness than the second, center layer of the sequence, and wherein the second, center layer has a smaller lattice constant and a smaller nanohardness than the third, upper layer of the sequence.

9. The solar cell stack according to claim 1, wherein, in the sequence of layers, the first, lower layer of the sequence has a larger lattice constant than the first semiconductor solar cell.

10. The solar cell stack according to claim 1, wherein, in the sequence of layers, the first, lower layer is integrally joined to the second, center layer and the second, center layer is integrally joined to the third, upper layer.

11. The solar cell stack according to claim 1, further comprising a third semiconductor solar cell, wherein an additional metamorphic buffer is formed between the second semiconductor solar cell and the third semiconductor solar cell or provided between the first semiconductor solar cell and the metamorphic buffer.

12. The solar cell stack according to claim 1, wherein the Al content increases by a substantially equal percentage as the In content decreases in a second direction opposite the first direction, and
   wherein the lattice constant in the metamorphic buffer and a bandgap in the metamorphic buffer change due to the Al content increase and the In content decrease.

* * * * *